United States Patent
Gupta et al.

(10) Patent No.: US 10,593,700 B2
(45) Date of Patent: *Mar. 17, 2020

(54) STANDARD CELL ARCHITECTURE WITH M1 LAYER UNIDIRECTIONAL ROUTING

(71) Applicant: QUALCOMM Incorporated, San Diego, CA (US)

(72) Inventors: Mukul Gupta, Bangalore (IN); Xiangdong Chen, San Diego, CA (US); Ohsang Kwon, San Diego, CA (US); Foua Vang, Anaheim, CA (US); Stanley Seungchul Song, San Diego, CA (US); Kern Rim, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/855,996

(22) Filed: Dec. 27, 2017

(65) Prior Publication Data

US 2018/0122824 A1 May 3, 2018

Related U.S. Application Data

(63) Continuation of application No. 14/279,250, filed on May 15, 2014, now Pat. No. 9,887,209.

(51) Int. Cl.
| | |
|---|---|
| *H01L 27/118* | (2006.01) |
| *H01L 23/535* | (2006.01) |
| *H01L 27/02* | (2006.01) |
| *H01L 27/092* | (2006.01) |
| *H01L 23/528* | (2006.01) |

(Continued)

(52) U.S. Cl.
CPC ...... *H01L 27/11807* (2013.01); *H01L 23/535* (2013.01); *H01L 27/0207* (2013.01); *H01L 27/092* (2013.01); *H01L 21/823475* (2013.01); *H01L 21/823871* (2013.01);

(Continued)

(58) Field of Classification Search
CPC .................................................. H01L 27/11807
See application file for complete search history.

(56) References Cited

U.S. PATENT DOCUMENTS

| | | |
|---|---|---|
| 6,034,433 A | 3/2000 | Beatty |
| 8,473,888 B2 | 6/2013 | Guo et al. |

(Continued)

*Primary Examiner* — Nduka E Ojeh
*Assistant Examiner* — Laura M Dykes
(74) *Attorney, Agent, or Firm* — Arent Fox, LLP

(57) ABSTRACT

A standard cell CMOS device includes metal oxide semiconductor transistors having gates formed from gate interconnects. The gate interconnects extend in a first direction. The device further includes M1 layer interconnects. The M1 layer interconnects are parallel to the gate interconnects and extend in the first direction only. The device further includes a M0 layer interconnect. The M0 layer interconnect extends directly over a first gate interconnect and extends in a second direction orthogonal to the first direction only. The M0 layer interconnect is below the M1 layer and is isolated from directly connecting to the first gate interconnect. The device further includes a layer interconnect that is different from the M1 layer interconnects and the M0 layer interconnect. The layer interconnect is connected to the M0 layer interconnect and is directly connected to a second gate electrode.

15 Claims, 5 Drawing Sheets

(51) Int. Cl.
  *H01L 21/8234*  (2006.01)
  *H01L 21/8238*  (2006.01)

(52) U.S. Cl.
  CPC . *H01L 23/5286* (2013.01); *H01L 2027/11874* (2013.01); *H01L 2924/0002* (2013.01)

(56) References Cited

U.S. PATENT DOCUMENTS

| | | |
|---|---|---|
| 8,513,978 B2 | 8/2013 | Sherlekar |
| 8,587,341 B1 | 11/2013 | Jhaveri |
| 2001/0045571 A1* | 11/2001 | Gandhi ............. H01L 21/76895 257/202 |
| 2006/0071319 A1 | 4/2006 | Nishimura |
| 2006/0220066 A1 | 10/2006 | Yoshida |
| 2009/0026503 A1 | 1/2009 | Tsuda |
| 2010/0155783 A1 | 6/2010 | Law et al. |
| 2011/0241126 A1 | 10/2011 | Herberholz |
| 2012/0223368 A1 | 9/2012 | Sherlekar et al. |
| 2013/0093022 A1 | 4/2013 | Choi |
| 2013/0334576 A1 | 12/2013 | Park et al. |
| 2015/0333008 A1 | 11/2015 | Gupta et al. |

* cited by examiner

STANDARD CELL ARCHITECTURE WITH M1 LAYER UNIDIRECTIONAL ROUTING

RELATED APPLICATIONS

This application is a Continuation Application of, and claims the priority benefit of, Non Provisional U.S. application Ser. No. 14/279,250 filed May 15, 2014.

FIELD

The present disclosure relates generally to a layout construction, and more particularly, to a standard cell architecture with metal one (M1) layer unidirectional routing.

BACKGROUND

A standard cell is an integrated circuit that may be implemented with digital logic. An application-specific integrated circuit (ASIC), such as a system-on-chip SoC device, may contain thousands to millions of standard cells. Such standard cells may occupy around 20% of an SoC. Reducing a size/area footprint of ASICs is beneficial. Accordingly, there is a need for reducing the size/area footprint of individual standard cells.

SUMMARY

In an aspect of the disclosure, a standard cell complementary metal oxide semiconductor (CMOS) device includes metal oxide semiconductor transistors having gates formed from gate interconnects. The gate interconnects extend in a first direction. The standard cell CMOS device further includes M1 layer interconnects. The M1 layer interconnects are parallel to the gate interconnects and extend in the first direction only. The standard cell CMOS device further includes a M0 layer interconnect. The M0 layer interconnect extends directly over a first gate interconnect and extends in a second direction orthogonal to the first direction only. The M0 layer interconnect is below the M1 layer and is isolated from directly connecting to the first gate interconnect. The standard cell CMOS device further includes a layer interconnect that is different from the M1 layer interconnect and the M0 layer interconnect. The layer interconnect is connected to the M0 layer interconnect and is directly connected to a second gate interconnect.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

To achieve sufficient cost, power, and performance benefits from semiconductor scaling (process shrink), a 50% area scaling may be preferred at each lithographic node. A 50% area scaling may require a corresponding metal pitch scaling, especially for lower metal layers, such as the M1 layer and the metal two (M2) layer. Traditionally, M1 layer routing is bidirectional. As the metal pitch (distance from the center of adjacent metal interconnects) shrinks with scaling, process issues increase, especially in relation to the processing of bidirectional M1 layer interconnects. For example, in the 20 nm semiconductor process technology, yield has decreased due to issues with bidirectional M1 layer interconnects. In order to address M1 layer process issues as a result of scaling, an exemplary standard cell architecture with a unidirectional M1 layer is provided infra. In addition, because unidirectional M1 layer interconnects may be insufficient alone to interconnect gate interconnects and transistor sources/drains, an exemplary metal interconnect for making interconnections is provided infra.

Figure 1:
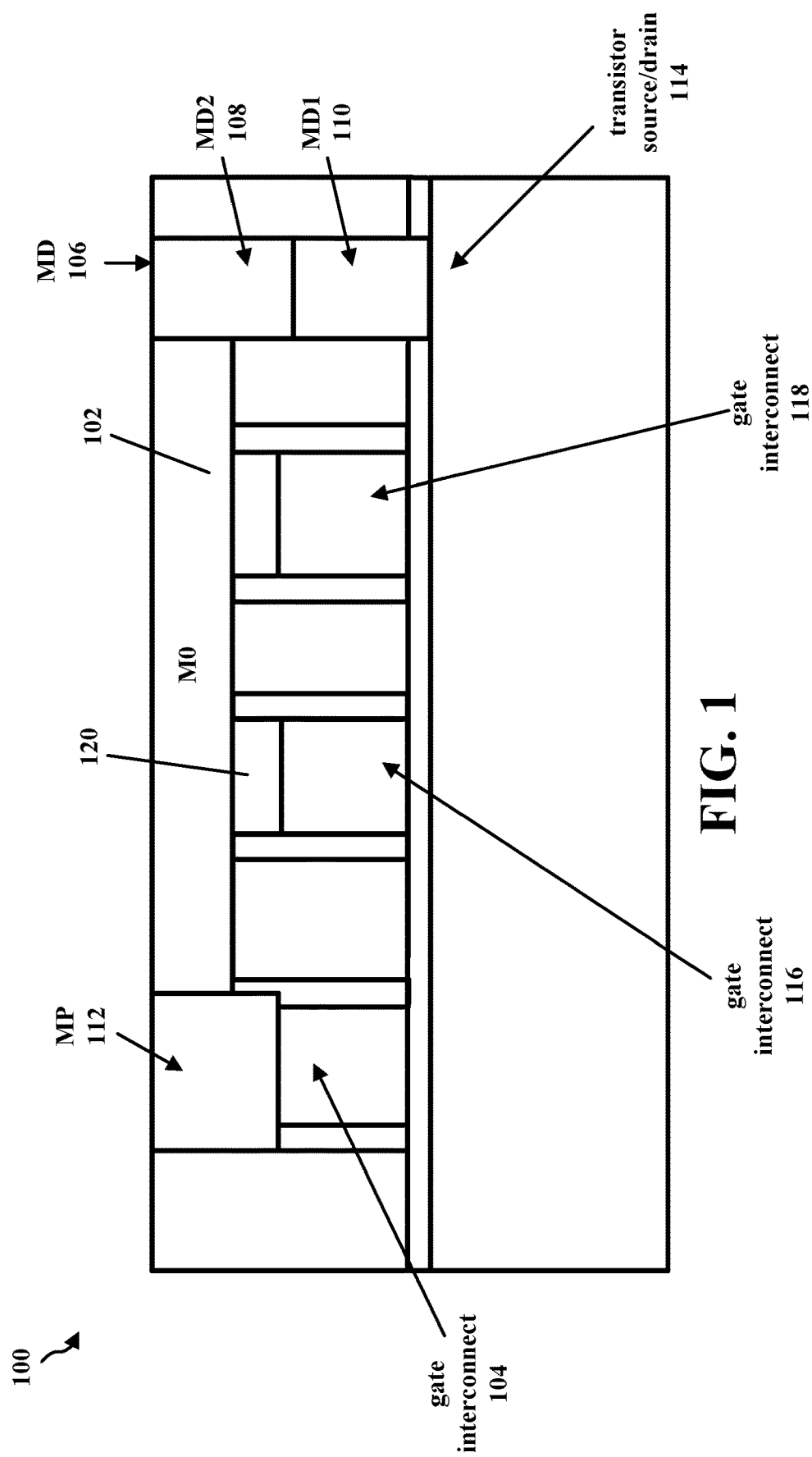
FIG. 1 is a diagram illustrating use of an exemplary metal interconnect that is below an M1 layer and isolated from directly connecting to a gate interconnect or a transistor source/drain.

FIG. 1 is a diagram 100 illustrating use of an exemplary metal interconnect that is below an M1 layer and isolated from directly connecting to a gate interconnect or a transistor source/drain. When the M1 layer is unidirectional and extends parallel to gate interconnects, M1 layer interconnects may be insufficient alone to interconnect gate interconnects and transistor sources/drains. Accordingly, an exemplary metal interconnect on a layer below the M1 layer that extends orthogonal to the gate interconnects may be used to interconnect transistor sources/drains, gate interconnects, and M1 layer interconnects. Such a metal layer may be referred to herein as a metal zero (M0) layer. M0 layer interconnects are formed of metal, such as tungsten. As shown in FIG. 1, an M0 layer interconnect 102 may extend orthogonal to gate interconnects to interconnect the gate interconnect 104 to the transistor source or drain 114. Specifically, in FIG. 1, the M0 layer interconnect 102 interconnects a metal POLY (MP) layer interconnect 112 to a metal diffusion (MD) layer interconnect 106. Elevations of the MD layer interconnect 106, the MP layer interconnect 112, and the M0 layer interconnect 102 are approximately the same. The M0 layer interconnect 102 is isolated by an electric insulator 120 from making direct contact with gate interconnects, such as the gate interconnects 116 and 118. The M0 layer interconnect 102 does not make direct contact with gate interconnects or transistor sources/drains. The MP layer interconnect 112 directly connects to the gate interconnect 104. The MD layer interconnect 106 directly contacts the transistor source/drain 114. The MD layer interconnect 106 may include interconnects on two layers, a first MD layer (MD1) 110 and a second MD layer (MD2) 108. As shown in FIG. 1, the M0 layer interconnect 102 interconnects the MP layer interconnect 112 with the MD2 layer interconnect 108 in order to connect the gate interconnect 104 and the transistor source/drain 114 together. However, M0 layer interconnects may interconnect MP layer interconnects together in order to interconnect gate interconnects to each other, MD layer interconnects together in order to interconnect transistor sources/drains to each other, and M1 layer interconnects through vias to MP/MD layer interconnects.

Figure 2:
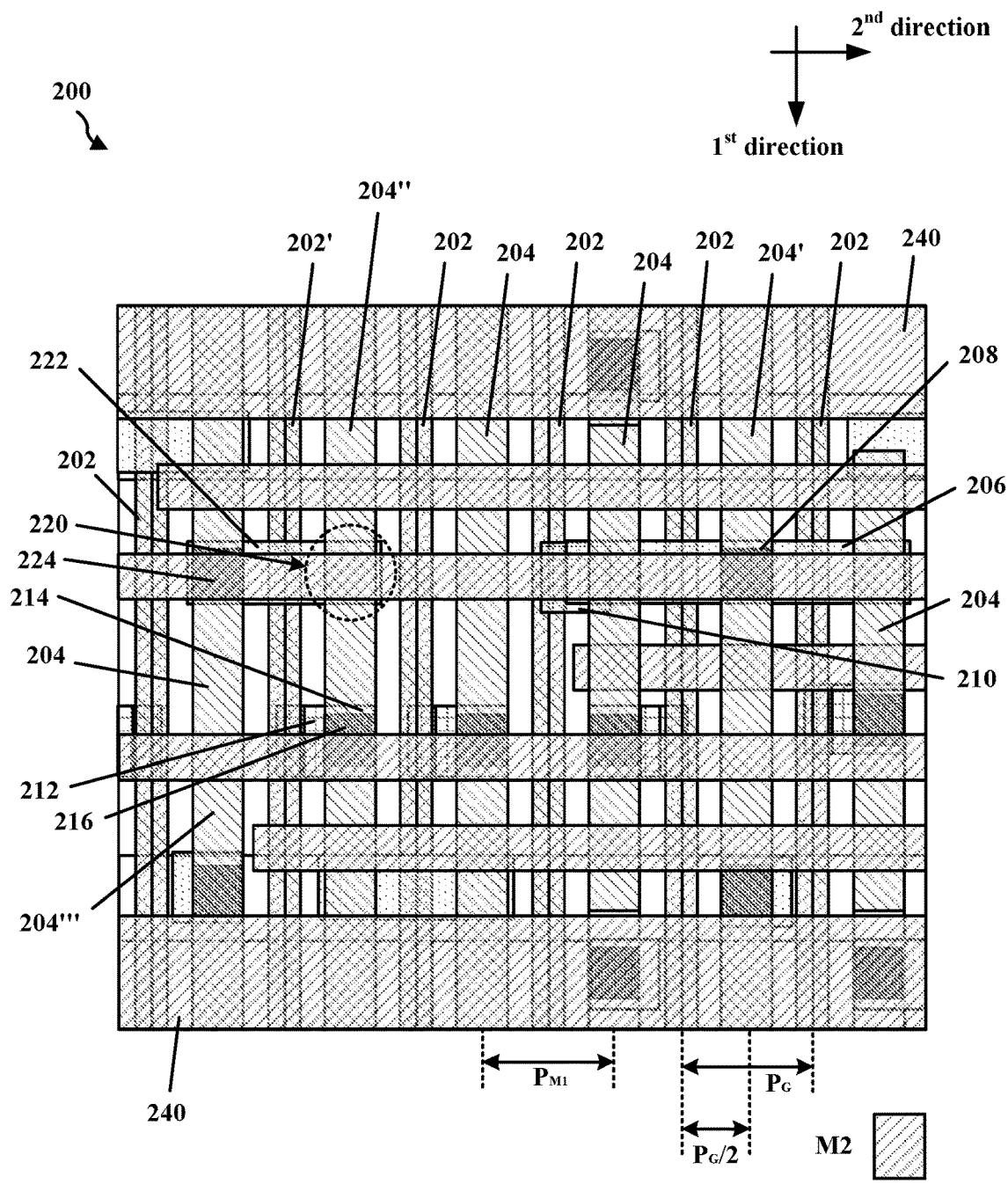
FIG. 2 is a diagram illustrating a standard cell architecture with M1 layer unidirectional fixed pitch routing.

FIG. 2 is a diagram 200 illustrating a standard cell architecture with M1 layer unidirectional fixed pitch routing. As shown in FIG. 2, M1 layer interconnects 204 extend between the power rails 240 in a first direction (e.g., vertical direction) only (unidirectional) parallel to the gate interconnects (also referred to as POLY gates/interconnects/lines) 202. The power rails 240 may be on an M1 layer (see FIGS. 4, 5) or an M2 layer (see FIGS. 2, 3). When the power rails 240 are on an M2 layer, the M1 layer interconnects 204 extend under the power rails 240. As shown in FIG. 2, the M1 layer interconnects 204 have the same pitch as the gate interconnects 202. That is, the pitch $P_{M1}$ of the M1 layer interconnects 204 is equal (or approximately equal) to the pitch $P_G$ of the gate interconnects 202. In addition, the M1 layer interconnects 204 are aligned to extend between gate interconnects 202. Accordingly, a center of the M1 layer interconnects 204 is about $P_G/2$ distance away from the center of the gate interconnects 202. Further, the M1 layer interconnects 204 may be rectangular shaped and have a same width.

With unidirectional, fixed pitch M1 layer routing, M0 layer interconnects may be used to facilitate interconnections with MP layer interconnects, MD layer interconnects, gate interconnects, and M1 layer interconnects. M0 layer interconnects extend in a second direction (e.g., horizontal direction) only, orthogonal to the M1 layer interconnects 204 and the gate interconnects 202. For example, the M0 layer interconnect 206 extends orthogonal to the M1 layer interconnects 204. The M0 layer interconnect 206 is connected to the MP layer interconnect 210 and to the M1 layer interconnect 204' through the via 208. For another example, the M0 layer interconnect 214 contacts the MP layer interconnect 212 and the via 216 in order to connect the M1 layer interconnect 204" to the corresponding gate interconnect 202'. For yet another example, the M0 layer interconnect 222 contacts the MD layer interconnect (at 220) and the via 224 in order to interconnect the corresponding transistor source/drain at 220 to the M1 layer interconnect 204'''.

Figure 3:
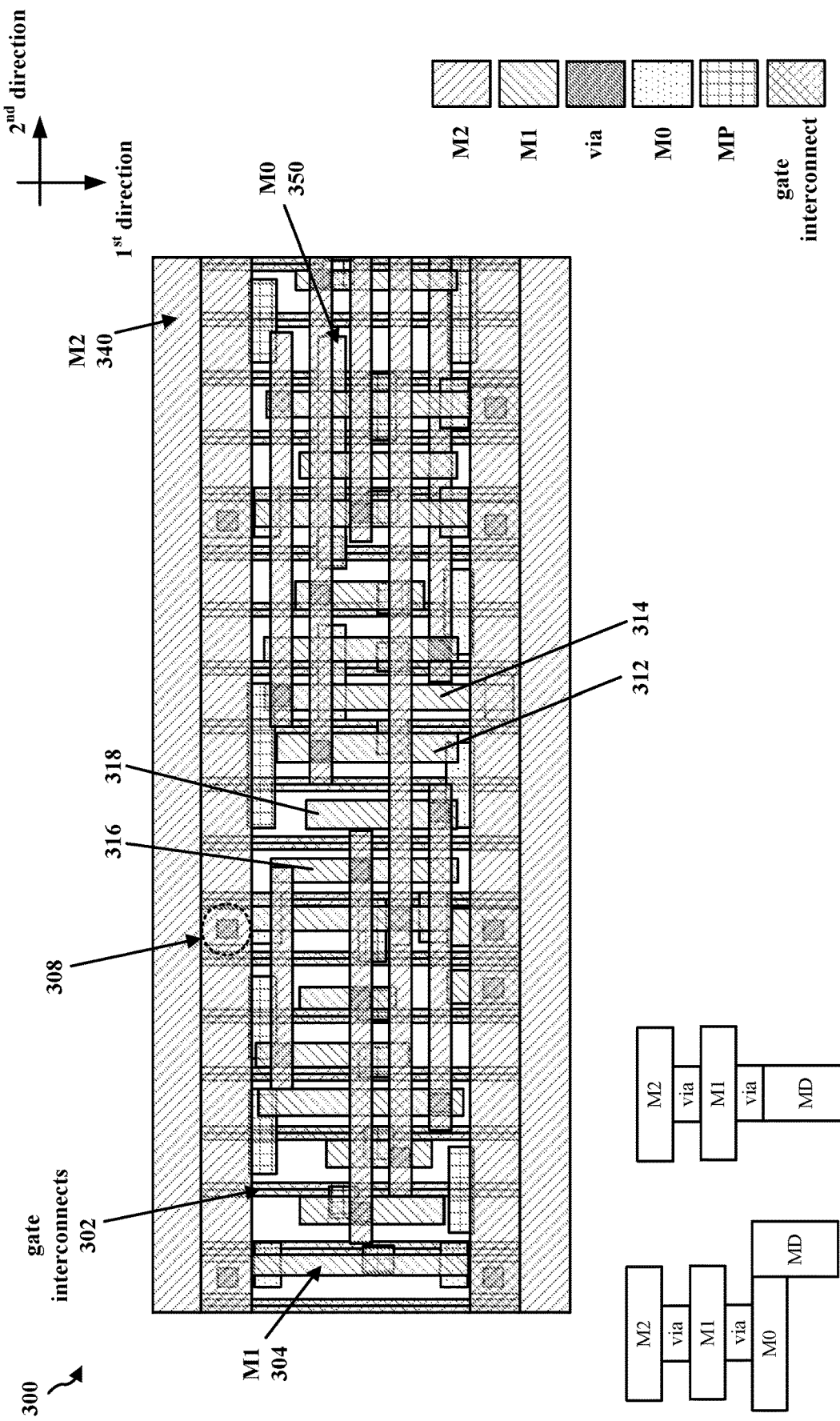
FIG. 3 is diagram illustrating a standard cell architecture with M1 layer unidirectional variable pitch routing.

FIG. 3 is diagram 300 illustrating a standard cell architecture with M1 layer unidirectional variable pitch routing. As shown in FIG. 3, M1 layer interconnects 304 extend in a first direction only (unidirectional) parallel to the gate interconnects 302. However, unlike in FIG. 2, the M1 layer interconnects 304 may have a variable pitch. Accordingly, the distance between the centers of the M1 layer interconnects 316 and 318 may be different than the distance between the centers of the M1 layer interconnects 312 and 314. The variable pitch of the M1 layer interconnects 304 allows for direct interconnections between M1 layer interconnects 304 and MP layer interconnects (through vias) without use of M0 layer interconnects. Accordingly, a standard cell architecture with M1 layer unidirectional variable pitch routing may need less use of M0 layer interconnects than a standard cell architecture with M1 layer unidirectional fixed pitch routing.

Referring again to FIG. 3, an MD layer interconnect at 308 is coupled to the M2 layer power rail 340. The MD layer interconnect at 308 may be connected to the M2 layer power rail 340 through a via, an M1 layer interconnect strap, and another via. Alternatively, the MD layer interconnect 308 may be connected to the M2 layer power rail 340 through an M0 layer interconnect, a via, an M1 layer interconnect strap, and another via.

Figure 4:
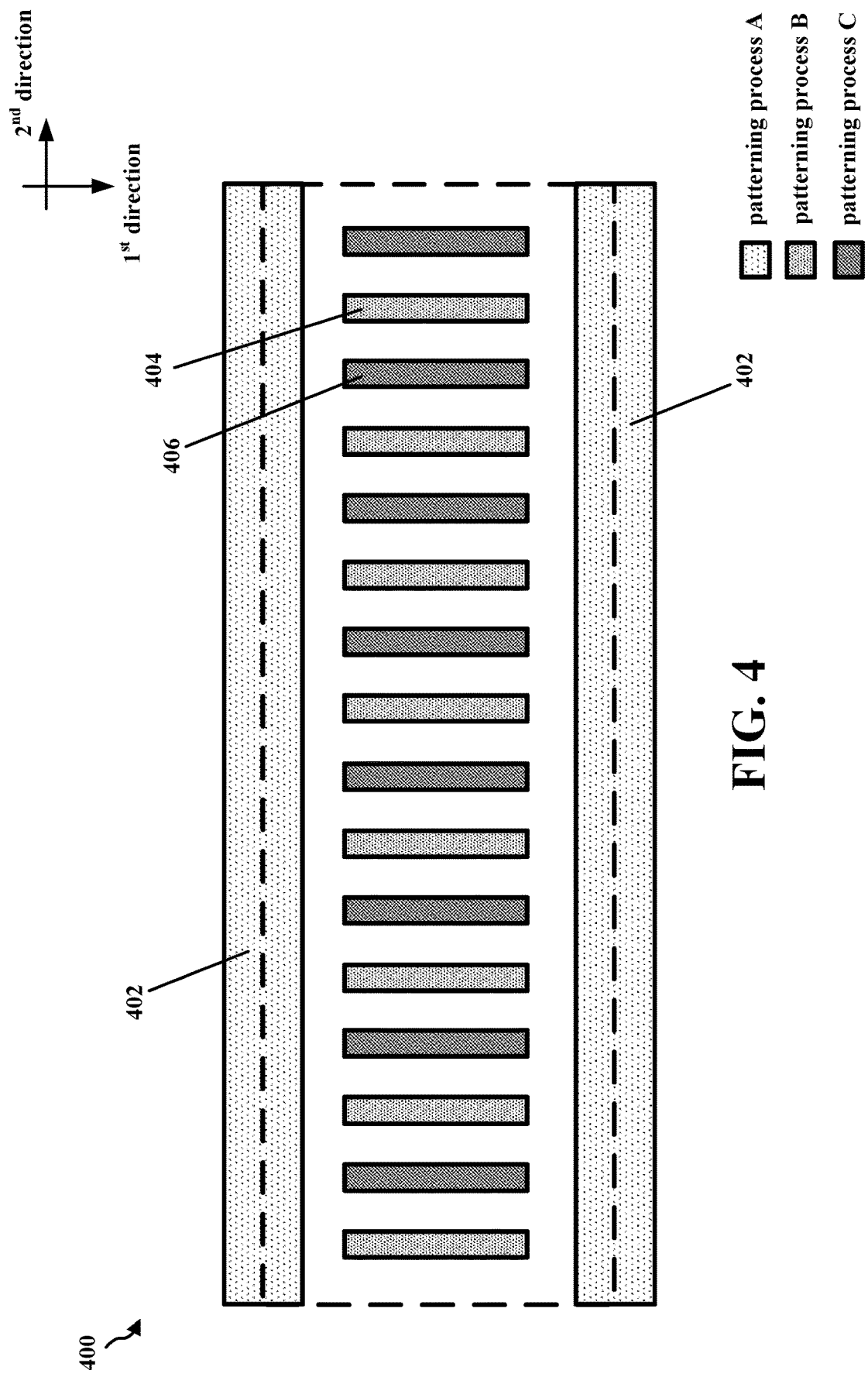
FIG. 4 is a diagram illustrating use of triple patterning for the M1 layer unidirectional interconnects and M1 power rails.

FIG. 4 is a diagram 400 illustrating use of triple patterning for the M1 layer unidirectional interconnects and M1 layer power rails. As discussed supra, unidirectional M1 layer interconnects may be implemented in a standard cell with M1 layer power rails. The M1 layer power rails 402 may be patterned in one patterning process (patterning process A), and the M1 layer interconnects 404 and 406 may be patterned in at least one additional process. In particular, the M1 layer interconnects 404 and 406 may be patterned in two separate patterning processes (patterning processes B and C), with the M1 layer interconnects 404 being patterned in one patterning process (patterning process B) and the M1 layer interconnects 406 being patterned in another patterning process (patterning process C). The M1 layer interconnects 404 and 406 may be interleaved. The patterning processes may occur in any order. For example, the patterning processes may be in the order A, B, C; A, C, B; B, A, C; B, C, A; C, A, B; or C, B, A. The patterning processes A, B, and C may be through litho-etch (LELE) followed by another litho-etch (LE) step, or through self-aligned double patterning (SADP) followed by an LE step. In one example, the patterning process for forming the M1 layer power rails 402 is performed last, and therefore the subsequent LE patterning process step (following LELE or SADP) may form the M1 layer power rails 402. Accordingly, in this example, the patterning processes may be in the order B, C, A or C, B, A.

In the processes A, B, and C, the reticles/photomasks for forming the M1 layer power rails 402 and the M1 layer interconnects 404, 406 are each in a single direction. That is, in the patterning process A, the reticles/photomasks for forming the M1 layer power rails 402 are in the same direction (second direction); in the patterning process B, the reticles/photomasks for forming the M1 layer interconnects 404 are in the same direction (first direction); and in the patterning process C, the reticles/photomasks for forming the M1 layer interconnects 406 are in the same direction (first direction). As a result, the power rails 402 extend only in the second direction, and the interconnects 404 and 406 extend only in the first direction, which is orthogonal to the second direction.

Figure 5:
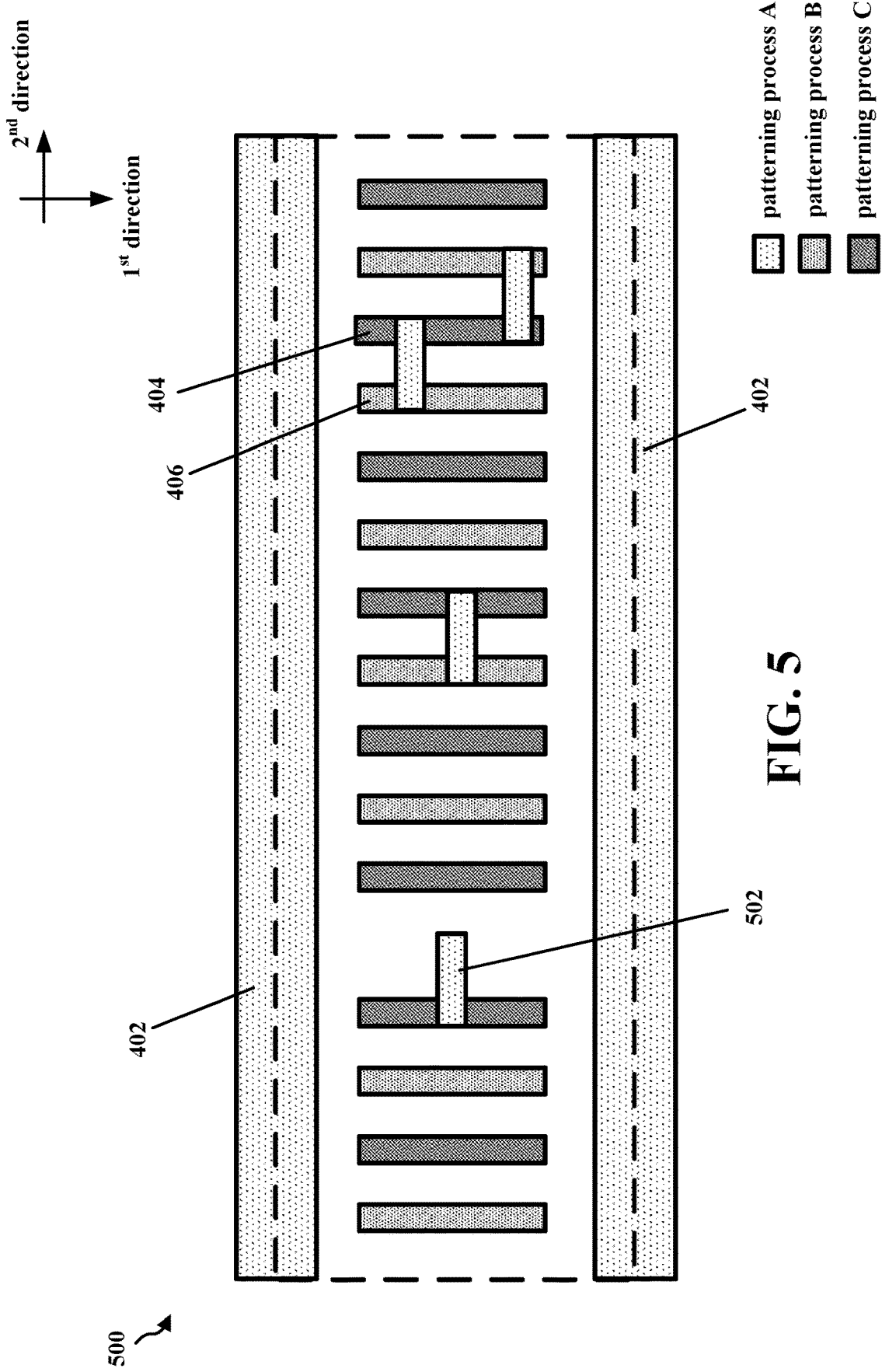
FIG. 5 is a diagram illustrating use of triple patterning for M1 layer interconnects and M1 power rails.

FIG. 5 is a diagram 500 illustrating use of triple patterning for M1 layer interconnects and M1 power rails. As discussed supra, M1 layer interconnects are unidirectional only within a standard cell. However, in one configuration, a standard cell may include unidirectional M1 layer interconnects extending in the first direction (e.g., vertical direction), and additional unidirectional M1 layer interconnects extending in the second direction (e.g., horizontal direction) for stitching between the unidirectional M1 layer interconnects extending in the first direction or for interconnecting the unidirectional M1 layer interconnects extending in the first direction with MD/MP layer interconnects. In such a configuration, the M1 layer power rails 402 and the M1 layer interconnects 502 may be patterned in one patterning process (patterning process A), and the M1 layer interconnects 404 and 406 may be patterned in at least one additional process. In particular, the M1 layer interconnects 404 and 406 may be patterned in two separate patterning processes (patterning processes B and C), with the M1 layer interconnects 404 being patterned in one patterning process (patterning process B) and the M1 layer interconnects 406 being patterned in another patterning process (patterning process C). The patterning processes may occur in any order. For example, the patterning processes may be in the order A, B, C; A, C, B; B, A, C; B, C, A; C, A, B; or C, B, A. The patterning processes A, B, and C may be through LELE followed by another LE step, or through SADP followed by an LE step. In one example, the patterning process for forming the M1 layer interconnects 502 is performed last, and therefore the subsequent LE patterning process step (following LELE or SADP) may form the M1 layer power rails 402 and the M1 layer interconnects 502. Accordingly, in this example, the patterning processes may be in the order B, C, A or C, B, A.

In the processes A, B, and C, the reticles/photomasks for forming the M1 layer power rails 402 and the M1 layer interconnects 404, 406 are each in a single direction. That is, in the patterning process A, the reticles/photomasks for forming the M1 layer power rails 402 and the M1 layer interconnects 502 are in the same direction (second direction); in the patterning process B, the reticles/photomasks for forming the M1 layer interconnects 404 are in the same direction (first direction); and in the patterning process C, the reticles/photomasks for forming the M1 layer interconnects 406 are in the same direction (first direction). As a result, the power rails 402 and interconnects 502 extend only in the second direction, and the interconnects 404 and 406 extend only in the first direction, which is orthogonal to the second direction.

Referring again to FIGS. 2-4, in one configuration, a standard cell CMOS device includes metal oxide semiconductor (MOS) transistors having gates formed from gate interconnects (e.g., 202, 302). The gate interconnects extend in a first direction. The CMOS device further includes power rails (e.g., 240, 340, 402) that provide power to the transistors. The power rails extend in a second direction orthogonal to the first direction. The CMOS device further includes M1 layer interconnects (e.g., 204, 304, 404, 406) extending between the power rails. At least one of the M1 layer interconnects is coupled to at least one of the transistors. The M1 layer interconnects are parallel to the gate interconnects and extend in the first direction only. Each of the M1 layer interconnects may be rectangular shaped and have a same width. As shown in FIG. 2, both the gate interconnects and the M1 layer interconnects may have a fixed pitch. In one configuration, a pitch of the gate interconnects is x and a pitch of the M1 layer interconnects is approximately x (accordingly, $P_{M1}=P_G=x$). In a subconfiguration, the M1 layer interconnects are offset from a center of the gate interconnects by approximately x/2. As shown in FIG. 3, the gate interconnects may have a fixed pitch and the M1 layer interconnects may have a variable pitch. In a first configuration, the power rails (e.g., 240, 340) are on an M2 layer. In such a configuration, at least one of the M1 layer interconnects extends under one of the power rails on the M2 layer. In a second configuration, as shown in FIG. 4, the power rails (e.g., 402) are on an M1 layer. In such a configuration, the power rails on the M1 layer are formed in one patterning process (e.g., patterning process A) and the M1 layer interconnects are formed in at least two additional patterning processes (e.g., patterning processes B and C). The CMOS device may further include a metal interconnect (e.g., the M0 layer interconnects 208, 214, 222, 350; also the M0 layer interconnect 102 of FIG. 1) extending over at least one gate interconnect of the gate interconnects. The metal interconnect extends in the second direction only. The metal interconnect is below an M1 layer and isolated from the at least one gate interconnect.

Referring again to FIG. 1, in one configuration, a standard cell CMOS device includes a plurality of MOS transistors having gates formed from gate interconnects (e.g., 104, 116, 118). The gate interconnects extend in a first direction. A metal interconnect (e.g., 102) extends over at least one gate interconnect (e.g., 116, 118) of the gate interconnects. The metal interconnect extends in a second direction only. The second direction is orthogonal to the first direction. The metal interconnect is below an M1 layer and isolated from the at least one gate interconnect. In one configuration, the metal interconnect contacts at least one of a metal drain/source interconnect (e.g., 106) that contacts a drain or a source of one of the transistors, or a metal gate interconnect (e.g., 112) that contacts one of the gate interconnects (e.g., 104). Elevations of the metal drain/source interconnect, the metal gate interconnect, and the metal interconnect are approximately the same. The metal interconnect may be connected to an M1 layer interconnect through a via. The at least one gate interconnect may be a plurality of gate interconnects, and the metal interconnect may extend over the plurality of gate interconnects. The metal interconnect may be isolated from the at least one gate interconnect by an electric insulator (e.g., 120).

Referring to FIG. 5, in one configuration, a standard cell CMOS device includes power rails (e.g., 402) that provide power to a plurality of transistors. The power rails extend in a second direction. The CMOS device further includes a first set of M1 layer interconnects (e.g., 404, 406) extending between the power rails in a first direction orthogonal to the second direction. The CMOS device further includes a second set of M1 layer interconnects (e.g., 502) extending between the power rails in the second direction. The second set of M1 layer interconnects is formed in a different patterning process than the first set of M1 layer interconnects. For example, the second set of M1 layer interconnects may be formed in patterning process A, and the first set of M1 layer interconnects may be formed in patterning processes B and C. Each of the M1 layer interconnects in the second set of M1 layer interconnects may be connected to an M1 layer interconnect in the first set of M1 layer interconnects. The second set of M1 layer interconnects may be formed in a same patterning process as the power rails (e.g., patterning process A). The first set of M1 layer interconnects may include a first subset of M1 layer interconnects (e.g., 404) and a second subset of M1 layer interconnects (e.g., 406). The first and second subsets of M1 layer interconnects may be interleaved. The first subset of M1 layer interconnects may be formed in a first patterning process (e.g., patterning process B) and the second subset of M1 layer interconnects may be formed in a second patterning process (e.g., patterning process C).

As discussed supra, M1 layer interconnects may be unidirectional in a first direction (e.g., vertical direction) in order to improve a manufacturing yield that is negatively affected by semiconductor scaling. With unidirectional M1 layer interconnects, an exemplary M0 layer interconnect may be used to interconnect MD, MP, gate, and M1 layer interconnects. The unidirectional M1 layer interconnects may have a fixed pitch. Alternatively, to reduce use of M0 layer interconnects, the unidirectional M1 layer interconnects may have a variable pitch. The M1 layer interconnects may be formed in two or more patterning processes. When the power rails are on an M1 layer, the power rails may be formed in one patterning process and the unidirectional M1 layer interconnects may be formed in at least two separate patterning processes. In one configuration, additional unidirectional M1 layer interconnects, which extend in a second direction (e.g., horizontal direction) and are orthogonal to the unidirectional M1 layer interconnects that extend in the first direction, may be used to interconnect the unidirectional M1 layer interconnects that extend in the first direction with other M1 layer interconnects and/or MP/MD layer interconnects.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A complementary metal oxide semiconductor (CMOS) device, comprising:
   metal oxide semiconductor transistors each having gates formed from gate interconnects, the gate interconnects extending in a first direction, and each having a source and a drain;
   metal one (M1) layer interconnects disposed on an M1 layer, the M1 layer interconnects being parallel to the gate interconnects and extending in the first direction only;
   a metal zero (M0) layer interconnect disposed on an M0 layer that extends directly over a first gate interconnect of the gate interconnects of the metal oxide semiconductor transistors, the M0 layer interconnect extending only in a second direction orthogonal to the first direction, the M0 layer interconnect being below the M1 layer and isolated from directly connecting to the first gate interconnect; and
   a single layer interconnect different from the M1 layer interconnects and the M0 layer interconnect, the single layer interconnect being connected to the M0 layer interconnect and being directly connected to a second gate interconnect of the gate interconnects.

2. The device of claim 1, further comprising a metal diffusion (MD) layer interconnect, the MD layer interconnect being connected to the M0 layer interconnect and directly contacts to a source or drain of the transistors.

3. The device of claim 2, wherein elevations of the MD layer interconnect, the single layer interconnect, and the M0 layer interconnect are approximately the same.

4. The device of claim 1, wherein the M0 layer interconnect connects the single layer interconnect to at least one of another layer interconnect or a metal diffusion (MD) layer interconnect.

5. The device of claim 1, further comprising power rails that provide power to the transistors, the power rails extending in the second direction.

6. The device of claim 5, wherein the power rails are on a metal two (M2) layer.

7. The device of claim 6, wherein at least one of the M1 layer interconnects extends under one of the power rails on the M2 layer.

8. The device of claim 5, wherein the power rails are on the M1 layer.

9. The device of claim 8, wherein the power rails on the M1 layer are formed in one patterning process and the M1 layer interconnects are formed in at least two additional patterning processes.

10. The device of claim 1, wherein the gate interconnects have a fixed pitch and the M1 layer interconnects have a variable pitch.

11. The device of claim 10, wherein the fixed pitch of the gate interconnects comprises a pitch of x and the variable pitch of the M1 layer interconnects comprises a pitch of approximately x.

12. The device of claim 1, wherein both the gate interconnects and the M1 layer interconnects have a fixed pitch.

13. The device of claim 12, wherein the fixed pitch of the gate interconnects comprises a pitch of x and the fixed pitch of the M1 layer interconnects comprises a pitch of approximately x.

14. The device of claim 13, wherein the M1 layer interconnects are offset from a center of the gate interconnects by approximately x/2.

15. The device of claim 1, wherein an elevation of the single layer interconnect and an elevation of the M0 layer interconnect is the same.

* * * * *